(12) United States Patent
Friedman et al.

(10) Patent No.: US 9,207,695 B2
(45) Date of Patent: Dec. 8, 2015

(54) CALIBRATION SCHEMES FOR CHARGE-RECYCLING STACKED VOLTAGE DOMAINS

(71) Applicant: International Business Machines Corporation, Armonk, NY (US)

(72) Inventors: Daniel Friedman, Sleepy Hollow, NY (US); Yong Liu, Rye, NY (US); Jose Tierno, Stamford, CT (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/445,775

(22) Filed: Jul. 29, 2014

(65) Prior Publication Data
US 2015/0301541 A1    Oct. 22, 2015

Related U.S. Application Data

(63) Continuation of application No. 13/601,240, filed on Aug. 31, 2012, now Pat. No. 8,797,084.

(51) Int. Cl.
*H03L 5/00* (2006.01)
*H03K 5/08* (2006.01)
*G05F 1/56* (2006.01)

(52) U.S. Cl.
CPC ... *G05F 1/56* (2013.01); *H03K 5/08* (2013.01)

(58) Field of Classification Search
CPC ......... H03K 5/08; H03K 3/011; H03K 3/012; H03K 3/015; H03K 3/356113; H03K 3/35613; H03K 3/356139; H03G 11/00; H03G 11/008; H02J 1/06; H02J 1/08; H02J 1/00; G01R 35/005; G01R 35/007; G01R 27/28; G01R 27/32; H03L 5/00
USPC ......... 327/306, 315, 316, 318, 321–323, 327, 327/331–333, 108–112, 379–391; 326/80, 326/82, 83, 30–34; 702/85–87; 710/52; 324/500, 519–522, 600, 601, 605, 606, 324/98, 750.02; 455/39, 500–502, 67.11, 455/69

See application file for complete search history.

(56) References Cited

U.S. PATENT DOCUMENTS 7,329,968 B2 * 2/2008 Shepard et al. ............. 307/18
7,368,950 B2 * 5/2008 Wu et al. .................... 326/83

(Continued)

FOREIGN PATENT DOCUMENTS

KR        640158 B1    10/2006
KR     2010104686 A     9/2010

OTHER PUBLICATIONS

Malkov, A., et al., "A Review of PVT Compensation Circuits for Advanced CMOS Technologies", Scientific Research Publishing, Inc., Jul. 2011, vol. 2, pp. 162-169.

(Continued)

*Primary Examiner* — Lincoln Donovan
*Assistant Examiner* — Thomas Skibinski
(74) *Attorney, Agent, or Firm* — Scully, Scott, Murphy & Presser, P.C.

(57) ABSTRACT

A method and system are disclosed for calibrating a mid-voltage node in an integrated circuit including an input-output circuit having charge-recycling stacked voltage domains including at least first and second voltage domains. In one embodiment, the method comprises transmitting data through the input-output circuit, including transmitting a first portion of the data across the first voltage domain, and transmitting a second portion of the data across the second voltage domain. The method further comprises measuring a specified characteristic of the data transmitted through the input-output circuit; and based on the measured specified characteristic, adjusting a voltage of said mid-voltage node to a defined value. The voltage of the mid-voltage node may be adjusted to accomplish a number of objectives, for example, to achieve a desired trade-off between power and performance, or so that the two voltage domains have the same performance.

20 Claims, 3 Drawing Sheets

CALIBRATION SCHEME: LOAD-AWARE DRIVER CALIBRATION

(56) References Cited

U.S. PATENT DOCUMENTS

| | | | |
|---|---|---|---|
| 7,679,397 | B1 | 3/2010 | Kok et al. |
| 8,081,011 | B2 * | 12/2011 | Azimi et al. .................... 326/33 |
| 2002/0079924 | A1 | 6/2002 | Hartmann et al. |
| 2005/0104624 | A1 | 5/2005 | Zumkehr et al. |
| 2009/0245010 | A1 | 10/2009 | Searles et al. |
| 2010/0329325 | A1 | 12/2010 | Mobin et al. |
| 2011/0109344 | A1 | 5/2011 | Choi et al. |
| 2011/0298440 | A1 | 12/2011 | Chang et al. |
| 2012/0019282 | A1 | 1/2012 | Millar |

OTHER PUBLICATIONS

Alon, E., et al., "Integrated Regulation for Energy-Efficient Digital Circuits", IEEE 2007 Custom Integrated Circuits Conference (CICC), Sep. 2007, vol. 43, Issue 8, pp. 389-392.

Rajapandian, S., et al., "High-Voltage Power Delivery Through Charge Recycling", IEEE Journal of Solid-State Circuits, Jun. 2006, vol. 41, No. 6, pp. 1400-1410.

Inti, R., et al., "A Highly Digital 0.5-to-4Gb/s 1.9mW/Gb/s Serial-Link Transceiver Using Current-Recycling in 90nm CMOS", ISSCC 2011, Feb. 2011, pp. 152-154.

* cited by examiner

CALIBRATION SCHEME: OPEN-LOOP CALIBRATION

CALIBRATION SCHEME: LOAD-AWARE DRIVER CALIBRATION

CALIBRATION SCHEMES FOR CHARGE-RECYCLING STACKED VOLTAGE DOMAINS

CROSS REFERENCE TO RELATED APPLICATION

This application is a continuation of co-pending U.S. patent application Ser. No. 13/601,240, filed Aug. 31, 2012, the disclosure of which is hereby incorporated herein by reference in its entirety.

STATEMENT OF GOVERNMENT INTEREST

This invention was made with Government support under Contract No.: HR0011-09-C-0002 (Defense Advanced Research Projects Agency (DARPA)). The Government has certain rights in this invention.

BACKGROUND OF THE INVENTION

This invention generally relates to integrated circuits having charge-recycling stacked voltage domains. More specifically, the invention relates to calibration schemes for such stacked voltage domains.

In the design and operation of integrated circuits, power consumption is a major concern. As a result of the devices on the circuits becoming smaller and of the higher performance requirements for the circuits, the circuits, or chips, are consuming more power, and the voltage levels supplied to the circuits are being reduced. This leads to a significant growth in the currents needed to operate the devices on the circuits.

In on-chip and inter-chip data communication systems where high data bandwidth is required, power dissipation and I/O area are very crucial. For instance, in modern multi-core microprocessors, processor cores and caches are connected by data buses having thousands of bits. In high-performance servers, the inter-chip links from processors to network switches or off-chip cache also require I/O buses hundreds of bits wide running at multiple Gb/s per lane data rates. Compact and low-power I/O schemes are needed for these high-performance systems. Among various circuit blocks in an I/O system, the signaling power dissipated on the channel consumes a big part of the overall I/O power. Since the signaling power is proportional to the square of the voltage swing transmitted on the channel, it is well known that reducing the signal swing will lower the signaling power.

Charge-recycling techniques have been presented to achieve reduced signal swing by stacking circuits with regular and predictable data switching activities, such as logic circuits [S. Rajapandian et al., "High-Voltage Power Delivery Through Charge Recycling", JSSC, pp. 1400-1410, June 2006] or clocking circuits [R. Inti et al., "Intergraded Regulation for Energy-Efficient Digital Circuits", ISSCC, pp. 152-153, February 2011]. Charge-recycling stacked low-swing I/O is also disclosed in U.S. Patent Application Publication No. 2011/0298440, the disclosure of which is hereby incorporated herein by reference. In charge-recycling stacked logic domains, two groups of drivers are logically stacked between the supply voltage and ground.

Since the voltage regulator provides regulation function only when there is current mismatch between the top and bottom driver groups, the on-chip voltage regulator can be very compact and highly efficient. Due to its high area and power efficiency, the charge-recycling stacked I/O scheme can be well suited for a variety of applications, including on-chip signaling, across-chip signaling in 3D chip stack and local chip-to-chip signaling through silicon carrier or other benign channels.

However, the I/O performance can be adversely affected due to chip process variations, supply voltage fluctuations and temperature deviations along the I/O bus. The charge-recycling stacked I/O should be robust against PVT variations, i.e., process, voltage and temperature variations. Appropriate calibration approaches are needed to achieve this robust I/O performance over different operating conditions.

BRIEF SUMMARY

Embodiments of the invention provide a method and system for calibrating a mid-voltage node in an integrated circuit including an input-output circuit having charge-recycling stacked voltage domains including at least first and second voltage domains. In one embodiment, the method comprises transmitting data through the input-output circuit, including transmitting a first portion of the data across the first voltage domain, and transmitting a second portion of the data across the second voltage domain. The method further comprises measuring a specified characteristic of the data transmitted through the input-output circuit; and based on the measured specified characteristic, adjusting a voltage of said mid-voltage node to a defined value.

In an embodiment, the input-output circuit includes a plurality of receivers; each of the voltage domains includes a plurality of transmit drivers; and in each of the voltage domains, each of the transmit drivers of the voltage domain transmits data to one of the receivers of the input-output circuit. The specified characteristic of the data is measured by measuring a specified performance characteristic of the data transmitted by one of the transmit drivers or of the data received by one of the receivers.

In one embodiment, the transmit drivers of the first voltage domain have variable strengths, and the voltage of said mid-voltage node is adjusted by adjusting the strength of at least one of the transmit drivers of the first voltage domain.

In an embodiment, the transmit drivers of the first voltage domain transmit data to a first group of the receivers, and the specified characteristic of the data is measured by monitoring an accuracy at which the first group of the receivers receive the data from the transmit drivers of the first voltage domain. The voltage of the mid-voltage node is adjusted by adjusting the strengths of the drivers of the first voltage domain, based on the monitored accuracy at which the first group of the receivers receive the data from the transmit drivers of the first voltage domain, to adjust the voltage of the mid-voltage node.

In one embodiment, the accuracy at which the first group of the receivers receive the data from the transmit drivers of the first voltage domain is monitored by detecting a size of a specified data eye for the first group of the receivers, in which the first group of the receivers accurately receive the data transmitted to the first group of the receivers from the transmit drivers of the first voltage domain. The strengths of the transmit drivers of the first voltage domain are adjusted by adjusting the strengths of the drivers of the first voltage domain based on the size of the specified data eye.

In an embodiment, procedure for adjusting the strengths of the drivers of the first voltage domain includes determining a size of a specified data eye for the first group of the receivers using predetermined values for specified parameters of the input-output circuit, and comparing the size of the detected data eye and the size of the determined data eye. When the size of the detected data eye is larger than the size of the determined data eye, the strengths of the drivers of the first voltage domain is reduced; and when the size of the detected data eye is smaller than the size of the determined data eye, the strengths of the drivers of the first voltage domain is increased.

In one embodiment, the specified characteristic is a given performance characteristic of both the first and second voltage domains, and the voltage of the mid-voltage node is adjusted until this given performance characteristic of both the first and second voltage domains are equal.

In an embodiment, each of the first and second voltage domains includes a plurality of drivers, the input-output circuit includes a plurality of receivers, the transmit drivers of the first voltage domain transmit data to a first group of the receivers, and the transmit drivers of the second voltage domain transmit data to a second group of the receivers. In an embodiment, the given performance characteristic of both the first and second voltage domains is measured by measuring a given performance characteristic of the first and second groups of the receivers, and the voltage of the mid-voltage node is adjusted until the given performance characteristic of the first and second groups of the receivers are equal.

In one embodiment, the drivers of the first voltage domain have variable strengths, and the voltage of the mid-voltage node is adjusted by adjusting the strengths of the drivers of the first voltage domain until the given performance characteristic of the first and second groups of the receivers are equal.

In one embodiment, the integrated circuit further include a supply voltage and a lower voltage for the first and second voltage domains, the first and second voltage domains are located electrically in series between said supply voltage and said lower voltage, and the mid-voltage node is located electrically in series between the first and second voltage domains.

In one embodiment, the method comprises transmitting data across the first and second voltage domains, and adjusting a voltage of said mid-voltage node to a defined value to obtain voltage drops across the first and second voltage domains. In an embodiment, each of the voltage domains includes a plurality of transmit drivers having variable strengths, and the voltage of the mid-voltage node is adjusted by adjusting the strength of at least one of the transit drivers of one of the voltage domains to adjust the voltage of the mid-voltage node to said defined value.

In an embodiment, each of the transmit drivers includes a plurality of transistors having on and off states, and the strength of at least one of the transmit drivers is adjusted by switching one or more of the transistors of said at least one of the transmit drivers between the off state and the on state.

DETAILED DESCRIPTION

Disclosed herein is a low voltage signaling technique for integrated circuit systems that substantially reduces I/O power through the use of charge recycling stacked voltage domains.

Figure 1:
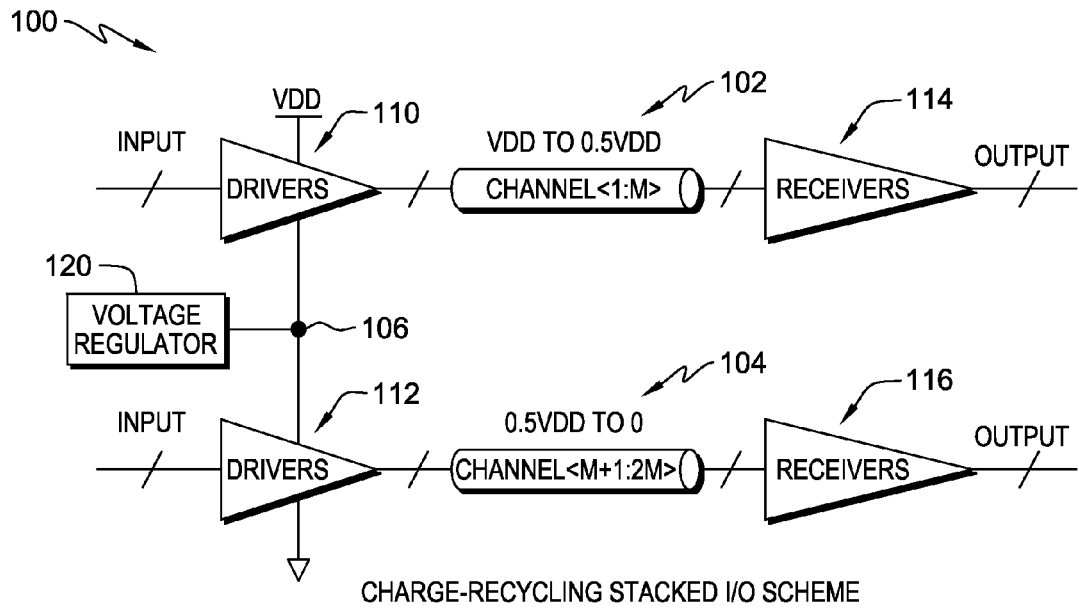
FIG. 1 illustrates a charge-recycling stacked voltage domain.

FIG. 1 shows an input-output circuit having a charge-recycling stacked I/O scheme. FIG. 1 shows, more particularly, a two stack circuit 100 comprising domains 102 and 104, with a mid supply node 106 between the two domains. Two groups of drivers are stacked between the supply voltage VDD and ground: M drivers 110 on the top domain 102 and M drivers 112 on the bottom domain 104 for a 2M-bit data bus. When the average current from the top drivers is equal to the average current from the bottom drivers, the mid-supply node VREG 106 is equal to 0.5 VDD, leading to a 0.5 VDD signal swing for both the top and bottom I/O domains 102 and 104.

In the operation of circuit 100, as the potential of the electrons decrease from VDD to VREG, that energy is used to perform logic in domain 102. The electrons are re-used from VREG 106 to perform logic in domain 104, thus resulting in a recycling of the current. Since the current from the top drivers 110 is reused by the bottom drivers 112, the power efficiency of the drivers is significantly improved over the low-swing I/O with linear regulator or current-mode logic (CML) drivers. The receivers 114 and 116 recover the low-swing signals (0.5 VDD) to full-swing signals (VDD). Receivers 114 and 116, it may be noted, may be in the voltage domain of VDD and ground. In an alternate embodiment, receiver 114 may be in voltage domain 102 and receiver 116 may be in voltage domain 104.

In the stacked drivers, when the current from the top drivers 110 does not match the current from the bottom drivers 112, the mid-supply node VREG deviates from 0.5 VDD, which reduces the voltage swing of either the top data bus or the bottom data bus. This deteriorates the overall I/O performance. Therefore, a voltage regulator 120 is added to stabilize the mid-supply node 106. Since most of the time, the two currents match, the voltage regulator does not need to consume a lot of power or area. Thus, the overhead of the power and area of the voltage regulator is very low, and the overall power and area efficiency of the charge-recycling stacked I/O circuit 100 is very high.

Figure 2:
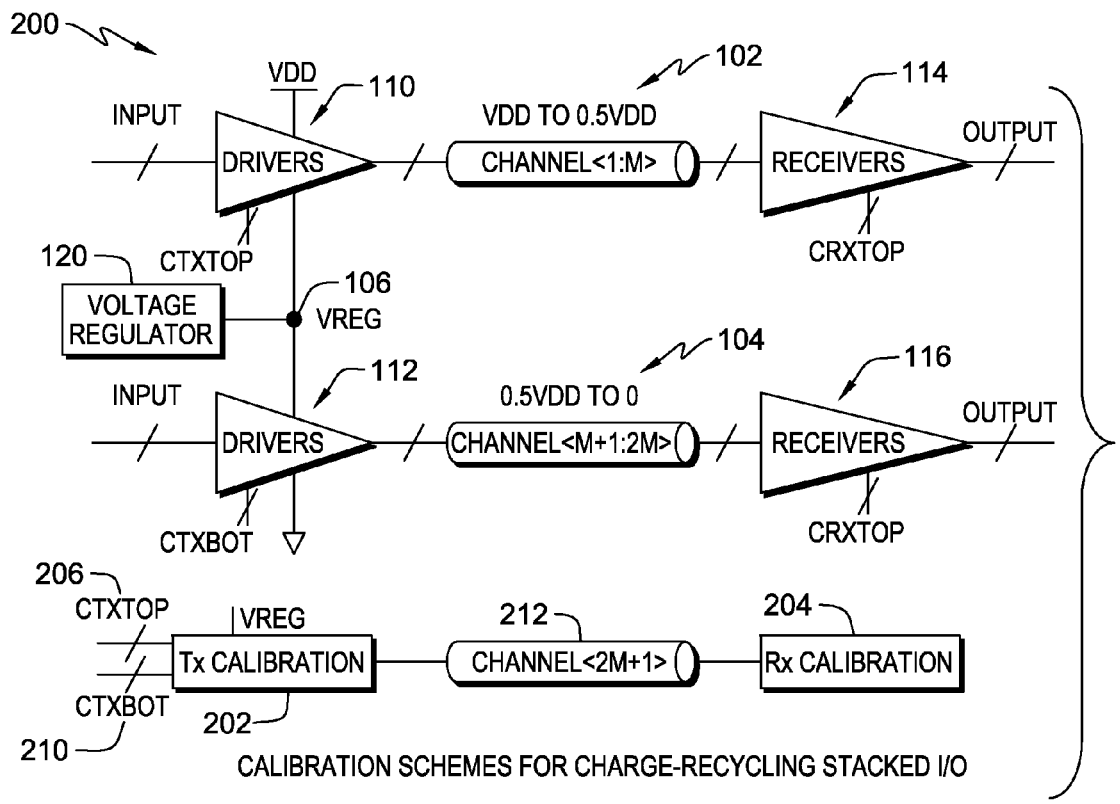
FIG. 2 is a circuit diagram showing a calibration scheme, in accordance with an embodiment of the invention, for the charge-recycling stacked voltage domain of FIG. 1.

FIG. 2 illustrates a calibration scheme 200 in accordance with an embodiment of the invention, for the charge-recycling stacked I/O scheme. With the circuit in FIG. 2, a transmitter calibration block 202 and a receiver calibration block 204 have been added to the circuit 100 of FIG. 1. The transmitter calibration block 202 and the receiver calibration block 204 sense the transmitter and receiver performance, respectively, and adjust the control codes 206, 210 to the transmitter drivers 110, 112. A dedicated channel 212 connects the two calibration blocks 202, 204 and sends control signals between them. The data rate of this channel can be very slow, so it does not require much power and area. On the transmitter side, the transmitter calibration block 202 gets the information from the mid-supply node VREG 106 and the receivers 114 and 116 and adjusts the control signals CTXTOP and CTXBOT. CTXTOP and CTXBOT control the driver strength of the drivers on the top and bottom domains 102, 104, respectively. On the receiver side, the receiver calibration block gets the information from the receiver data output and sends the information back to the transmitter calibration block 204 through the dedicated channel 212.

Any suitable procedure may be used to measure or monitor the performances of the transmitters, the receivers, or the two domains 102 and 104, or of the data transmitted through the input-output circuit. For example, as discussed in more detail below, calibration scheme 200 may be based on measuring or detecting errors, or the rate of errors, in the data sent from the transmitters in each of the voltage domains 102 and 104.

Figure 3:
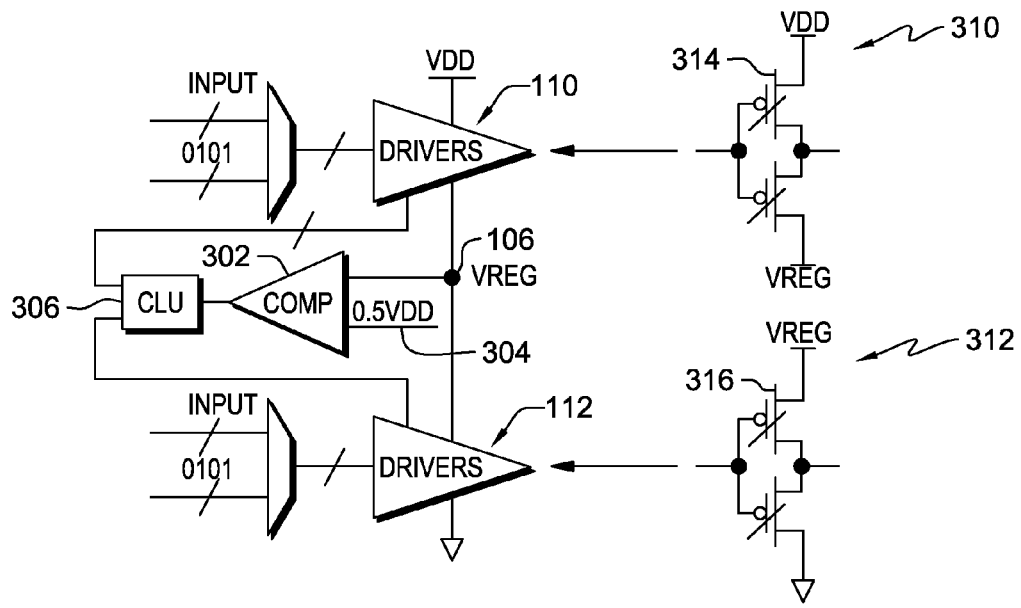
FIG. 3 depicts an open-loop calibration scheme for the charge-recycling stacked voltage domains, in accordance with an embodiment of the invention.

FIG. 3 shows a calibration approach: open-loop calibration. This calibration approach, in embodiments of the invention, maintains the mid-supply node VREG at 0.5 VDD in different operating conditions. A voltage comparator 302 compares VREG 106 with a reference voltage 304 0.5 VDD that can be generated from a simple resistor divider or a complex band-gap voltage generator. The comparator output is sent to a control logic unit 306 (CLU). The CLU determines how to adjust the drivers 110, 112 to pull VREG back to 0.5 VDD: if VREG<0.5 VDD, the top drivers 110 will be adjusted to be stronger; if VREG>0.5 VDD, the bottom drivers 112 will be adjusted to be stronger.

For example, as illustrated at 310 and 312 in a voltage-mode driver, each driver can have multiple transistors 314, 316. By turning on more transistors, the driver becomes stronger and the equivalent resistance is smaller; by turning off more transistors, the driver becomes weaker and the equivalent resistance is larger. In this way, VREG 106 can be adjusted toward 0.5 VDD. This calibration procedure, in embodiments of the invention, may be done with balanced data pattern to remove the effect of unbalanced data transition density. Therefore, a 0101 data pattern for example, may be chosen when this calibration is performed.

Figure 4:
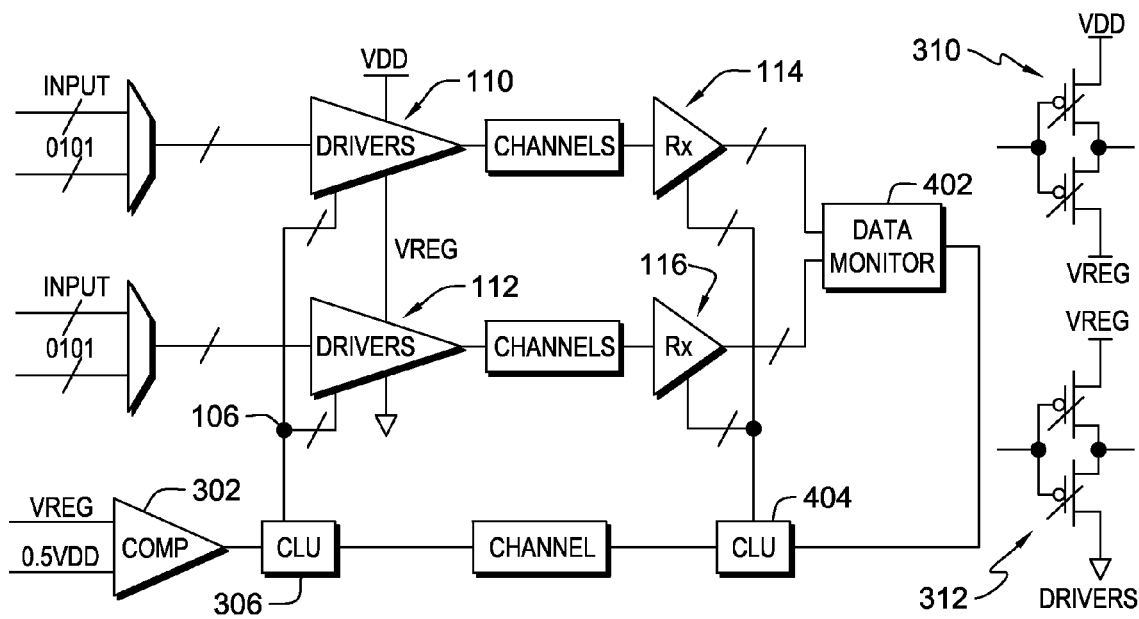
FIG. 4 shows a further, load-aware calibration scheme for the charge-recycling stacked logic domain, in accordance with an embodiment of the invention.

FIG. 4 shows another calibration scheme: load-aware driver calibration. This calibration approach, in embodiments of the invention, may be used to find an optimum operating balance for the transmitter between high performance and low power. As a general rule, for channels that are not very long and that do not have much channel loss, the greater the transmitter driver strength, the better the I/O performance. However, a larger transmitter driver strength normally means a higher transmitter power. Therefore, a tradeoff must be made between power and performance. In the calibration approach of FIG. 4, a 0101 data pattern is sent through the transmitter to the channel. The transmitter is initially set to maximum driver strength, which means the signal swing is at its maximum value. On the receiver side, a data monitor 402 measures the receiver output. The receiver CLU 404 adjusts the input receiver threshold voltage. The receiver threshold voltage is slowly adjusted until the data monitor detects a data error (that is, a pattern that is not the 0101 pattern).

In this way, the CLU 404 detects the receiver vertical data eye. Also, based on the system specifications and operating conditions, a preset receiver vertical data eye threshold voltage is determined. When the receiver vertical data eye is larger than the preset eye threshold voltage, the I/O can function with acceptable performance over various operating conditions. The receiver CLU 404 compares the detected receiver vertical data eye and the preset eye threshold. If the detected receiver vertical data eye is larger than the preset eye threshold, the receiver CLU 404 sends a request signal to the transmitter to reduce the driver strength. If the detected receiver vertical data eye is smaller than the preset eye threshold voltage, the receiver CLU 404 sends a request signal to the transmitter to increase the driver strength. This procedure is repeated until the detected receiver data eye is reduced to the preset receiver eye threshold.

Similarly, the calibration scheme presented in FIG. 4 can also be performed with a horizontal data eye. The horizontal data eye can be measured by adjusting the receiver clock phase. The measured horizontal eye is compared with a preset horizontal eye threshold. The transmitter drivers are adjusted until the measured horizontal eye is near the preset horizontal eye threshold.

In FIG. 4, all the drivers in the top and bottom driver groups are adjusted together to increase or decrease the driver strength. The calibration schemes in FIG. 3 and FIG. 4 are independent of each other; and in embodiments of the invention, a circuit may be provided with both calibration approaches, and the two approaches can be separately performed.

Due to process variations in the manufacture of the integrated circuit, the performance of the top drivers 110 and bottom drivers 112 may be different and the performance of the top receivers 114 and the bottom receivers 116 may also be different. Therefore, the optimum mid-supply voltage VREG 106, may not necessarily be 0.5 VDD. The calibration scheme in FIG. 5 handles this issue and tries to set VREG at an optimum voltage level, Vopt. This calibration scheme operates in a way similar as that of the calibration scheme in FIG. 4. VREG is adjusted based on the performance of the top and bottom receivers 114 and 116. A receiver data monitor 502 is provided to monitor the performance of the top receivers 114 and the bottom receivers 116, and if the top receivers have better performance than the bottom receivers, i.e., larger input receiver data eye, VREG will be increased. If the bottom receivers 116 have better performance than the top receivers 114, VREG will be decreased. This is repeated until the top and bottom receivers have the same performance.

Figure 5:
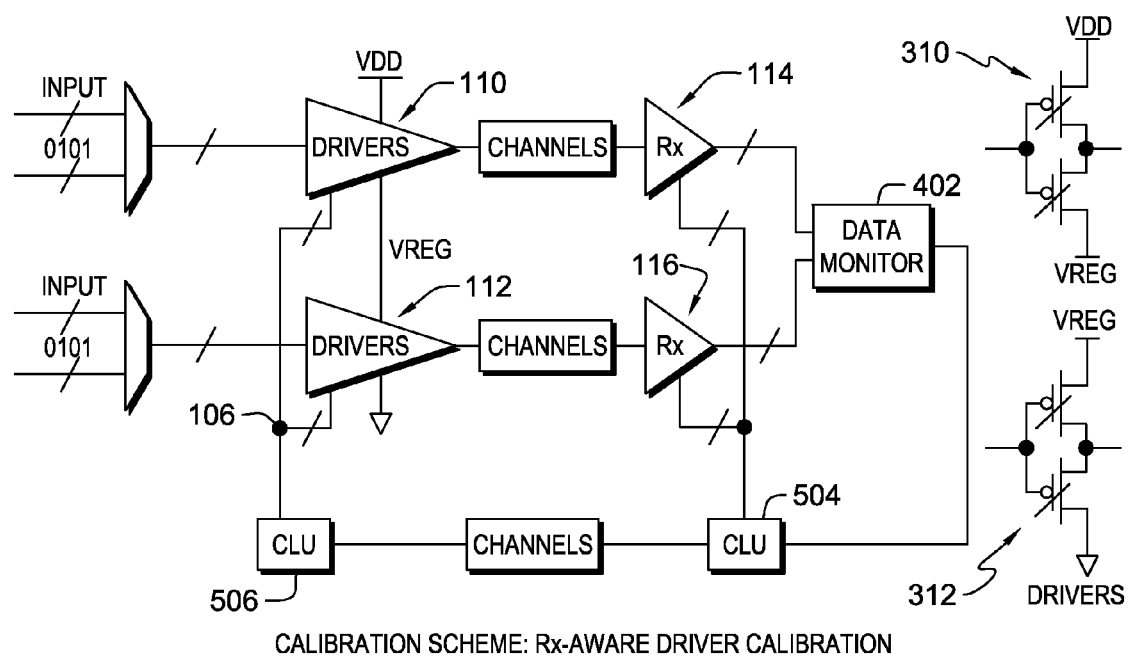
FIG. 5 illustrates a receiver-aware driver calibration scheme, in accordance with an embodiment of the invention.

Different from the calibration schemes shown in FIG. 3 and FIG. 4, the calibration scheme shown in FIG. 5 does not make VREG equal to 0.5 VDD (the voltage comparator shown in FIG. 3 and FIG. 4 is not shown in FIG. 5). From the feedback from the receiver CLU 504, the transmitter CLU 506 directly changes the transmitter driver strength in one of the two driver groups 110, 112 until the top and bottom receivers 114 and 116 have, for example, the same receiver vertical data eye. Other parameters may be used to measure the performance of the top and bottom receivers.

The description of the present invention has been presented for purposes of illustration and description, and is not intended to be exhaustive or to limit the invention in the form disclosed. Many modifications and variations will be apparent to those of ordinary skill in the art without departing from the scope of the invention. The embodiments were chosen and described in order to explain the principles and application of the invention, and to enable others of ordinary skill in the art to understand the invention for various embodiments with various modifications as are suited to the particular use contemplated.

What is claimed is:

1. A system for calibrating a mid-voltage node in an integrated circuit including an input-output circuit having charge-recycling stacked voltage domains including at least first and second voltage domains, wherein data, including first and second data portions, are transmitted through the input-output circuit, the first portion of the data are transmitted across the first voltage domain, and a second portion of the data are transmitted across the second voltage domain, the system comprising:
   measuring sub-circuit for measuring a specified characteristic of the data transmitted through the input-output circuit; and
   a voltage regulator sub-circuit for adjusting a voltage of said mid-voltage node to a defined value based on the measured specified characteristic.

2. The system according to claim 1, wherein the input-output circuit includes a plurality of receivers, each of the voltage domains includes a plurality of transmit drivers, and in each of the voltage domains, each of the transmit drivers of the voltage domain transmits data to one of the receivers of the input-output circuit, and wherein:

the measuring sub-circuit measures a specified performance characteristic of the data transmitted by one of the transmit drivers or of the data received by one of the receivers.

3. The system according to claim 2, wherein the transmit drivers of the first voltage domain have variable strengths, and wherein:

the voltage regulator sub-circuit adjusts the strength of at least one of the transmit drivers of the first voltage domain to adjust the voltage of said mid-voltage node.

4. The system according to claim 2, wherein the transmit drivers of the first voltage domain transmit data to a first group of the receivers, and the transmit drivers of the first voltage domain have variable strengths, and wherein:

the measuring sub-circuit includes a monitor for monitoring an accuracy at which the first group of the receivers receive the data from the transmit drivers of the first voltage domain; and the voltage regulator sub-circuit includes a control logic unit for adjusting the strengths of the drivers of the first voltage domain, based on the monitored accuracy at which the first group of the receivers receive the data from the transmit drivers of the first voltage domain, to adjust the voltage of the mid-voltage node.

5. The system according to claim 4, wherein:

the monitor detects a size of a specified data eye for the first group of the receivers, in which the first group of the receivers accurately receive the data transmitted to the first group of the receivers from the transmit drivers of the first voltage domain; and the control logic unit adjusts the strengths of the drivers of the first voltage domain based on the size of the specified data eye.

6. The system according to claim 5, wherein:

the measuring sub-circuit includes a control logic unit for determining a size of a specified data eye for the first group of the receivers using predetermined values for specified parameters of the input-output circuit, and for comparing the size of the detected data eye and the size of the determined data eye; and the control logic unit of the voltage regulator sub-circuit reduces the strengths of the drivers of the first voltage domain when the size of the detected data eye is larger than the size of the determined data eye, and increases the strengths of the drivers of the first voltage domain when the size of the detected data eye is smaller than the size of the determined data eye.

7. The system according to claim 1, wherein:

the measuring sub-circuit measures a given performance characteristic of both the first and second voltage domains; and the voltage regulator sub-circuit includes a control logic unit for adjusting the voltage of the mid-voltage node until the measured given performance characteristic of both the first and second voltage domains are equal.

8. The system according to claim 7, wherein each of the first and second voltage domains includes a plurality of drivers, the input-output circuit includes a plurality of receivers, the transmit drivers of the first voltage domain transmit data to a first group of the receivers, and the transmit drivers of the second voltage domain transmit data to a second group of the receivers, and wherein:

the measuring sub-circuit measures a given performance characteristic of the first and second groups of the receivers; and the control logic unit adjusts the voltage of the mid-voltage node until the given performance characteristic of the first and second groups of the receivers are equal.

9. The system according to claim 8, wherein the drivers of the first voltage domain have variable strengths, and wherein:

the control logic unit adjusts the strengths of the drivers of the first voltage domain until the given performance characteristic of the first and second groups of the receivers are equal.

10. The system according to claim 1, wherein:

the integrated circuit further include a supply voltage and a lower voltage for the first and second voltage domains;

the first and second voltage domains are located electrically in series between said supply voltage and said lower voltage; and the mid-voltage node is located electrically in series between the first and second voltage domains.

11. An integrated circuit comprising:

an integrated circuit including an input-output circuit having charge-recycling stacked voltage domains including at least first and second voltage domains;

a mid-voltage node between the first and second voltage domains;

a supply voltage for the charge-recycling stacked voltage domains;

a ground voltage, and wherein said first and second voltage domains are located in series between said supply voltage and said ground, and data, including first and second data portions, are transmitted through the input-output circuit, the first portion of the data are transmitted across the first voltage domain, and the second portion of data are transmitted across the second voltage domain; and system for calibrating the mid-voltage node, and including:

a measuring sub-circuit for measuring a specified characteristic of the data transmitted through the input-output circuit; and a voltage regulator sub-circuit for adjusting a voltage of said mid-voltage node to a defined value based on the measured specified characteristic.

12. The integrated circuit according to claim 11, wherein:

the input-output circuit includes a plurality of receivers;

each of the first and second voltage domains includes a set of transmit drivers;

in each of the voltage domains, the transmit drivers of the voltage domain transmit data to an associated group of the receivers of the input-output circuit; and the measuring sub-circuit includes a monitor for measuring a defined performance parameter of the groups of the receivers.

13. The integrated circuit according to claim 12, wherein:

the drivers of the first and second voltage domains are variable strength drivers; and the voltage regulator sub-circuit includes a control logic unit for adjusting the strengths of the drivers of the first and second voltage domains, based on the measured defined performance parameter of the groups of the receivers, to adjust the voltage of the mid-voltage node to the defined value.

14. The integrated circuit according to claim 12, wherein:

the measuring sub-circuit includes a control logic unit for measuring a parameter based on an accuracy at which the associated groups of the receivers receiver data from the transmit drivers; and the voltage regulator sub-circuit includes a control logic unit for adjusting the voltage of the mid-range node based on said measured parameter.

15. The integrated circuit according to claim 11, wherein:
the measuring sub-circuit measures the same, defined performance characteristic of both the first and second voltage domains; and
the voltage regulator sub-circuit adjusts the voltage of the mid-voltage node until said defined performance characteristic of the first voltage domain and said defined performance characteristic of the second voltage domain are equal.

16. A system for calibrating a mid-voltage node in an integrated circuit having charge-recycling stacked voltage domains including at least first and second voltage domains, wherein data are transmitted across the first and second voltage domains, and each of the voltage domains includes a plurality of transmit drivers having variable strengths, the system comprising:
a voltage regulator sub-circuit including a control logic unit for adjusting a voltage of said mid-voltage node to a defined value to obtain voltage drops across the first and second voltage domains by adjusting the strength of at least one of the transmit drivers of one of the voltage domains to adjust the voltage of the mid-voltage node to said defined value.

17. The system according to claim 16, wherein each of the transmit drivers includes a plurality of transistors having on and off states, and wherein"
the control logic unit adjusts the strength of at least one of the transmit drivers by switching one or more of the transistors of said at least one of the transmit drivers between the off state and the on state.

18. The system according to claim 16, wherein the integrated circuit includes a voltage supply for the first and second voltage domains, and the mid-voltage node is located electrically in series between the first and second voltage domains.

19. The system according to claim 18, wherein the integrated circuit includes a ground, and the first and second voltage domains are electrically located in series between the voltage supply and the ground; and wherein:
the control logic unit adjusts the voltage of the mid-voltage node to maintain the voltage of the mid-voltage node substantially mid-way between the voltage of the voltage supply and ground.

20. The system according to claim 16, wherein the control logic unit adjusts the voltage of the mid-voltage node to maintain the voltage of the mid-voltage node substantially constant.

* * * * *